(12) United States Patent
Van Der Sijde et al.

(10) Patent No.: US 11,302,732 B2
(45) Date of Patent: Apr. 12, 2022

(54) ARRAY WITH LIGHT EMITTING DIODES AND VARYING LENS

(71) Applicant: Lumileds LLC, San Jose, CA (US)

(72) Inventors: Arjen Van Der Sijde, Eindhoven (NL); Nicola Pfeffer, Eindhoven (NL); Emanuel Nicolaas Hermanus Johannes Stassar, Sprang Capelle (NL)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/477,371

(22) PCT Filed: Jan. 5, 2018

(86) PCT No.: PCT/EP2018/050276
§ 371 (c)(1),
(2) Date: Jul. 11, 2019

(87) PCT Pub. No.: WO2018/130467
PCT Pub. Date: Jul. 19, 2018

(65) Prior Publication Data
US 2019/0383465 A1  Dec. 19, 2019

(30) Foreign Application Priority Data
Jan. 13, 2017  (EP) .................... 17151409

(51) Int. Cl.
*H01L 27/146* (2006.01)
*F21L 4/02* (2006.01)
(Continued)

(52) U.S. Cl.
CPC ........ *H01L 27/14627* (2013.01); *F21L 4/027* (2013.01); *F21V 5/045* (2013.01);
(Continued)

(58) Field of Classification Search
CPC ............. F21Y 2105/14; F21Y 2115/10; H01L 27/14627; H01L 27/156; H01L 33/58; F21L 4/027; F21V 5/045
See application file for complete search history.

(56) References Cited

U.S. PATENT DOCUMENTS 6,075,648 A    6/2000  Yamamoto et al.
6,616,299 B2   9/2003  Martineau
(Continued)

FOREIGN PATENT DOCUMENTS

CA     2485669 A1    12/2005
CN    201401725 Y     2/2010
(Continued)

OTHER PUBLICATIONS

A machine translation of CN105987313A published on Oct. 5, 2016. (Year: 2016).*
(Continued)

*Primary Examiner* — Cheung Lee
(74) *Attorney, Agent, or Firm* — Volpe Koenig

(57) ABSTRACT

The invention describes a light emitting diode array module comprising at least two light emitting diodes and a lens, wherein the lens comprises one common lens segment, wherein the common lens segment comprises a multitude of sections at least partly encompassing an axis perpendicular to the lens, wherein the sections shape an uneven surface of the lens, wherein the light emitting diodes are arranged to illuminate at least two non-overlapping target areas in a reference plane, and wherein the sections are arranged such that at least one light emitting diode illuminates one respective target area of the target areas. The invention further describes a flash light comprising at least one light emitting diode array module.

19 Claims, 5 Drawing Sheets

(51) Int. Cl.
*F21V 5/04* (2006.01)
*H01L 27/15* (2006.01)
*H01L 33/58* (2010.01)
*F21Y 115/10* (2016.01)

(52) U.S. Cl.
CPC ............ *H01L 27/156* (2013.01); *H01L 33/58* (2013.01); *F21Y 2115/10* (2016.08)

(56) References Cited

U.S. PATENT DOCUMENTS

| | | | |
|---|---|---|---|
| 7,150,552 | B2 | 12/2006 | Weidel |
| 8,794,777 | B2 | 8/2014 | Ito |
| 8,858,023 | B2 | 10/2014 | Yang |
| 9,466,773 | B2 | 10/2016 | Streppel et al. |
| 9,946,055 | B2 | 4/2018 | Krun et al. |
| 2006/0139953 | A1 | 6/2006 | Chou et al. |
| 2010/0061105 | A1* | 3/2010 | Shyu ............... F21V 5/045 362/311.02 |
| 2012/0119657 | A1 | 5/2012 | Snijder et al. |
| 2015/0003103 | A1 | 1/2015 | Tukker et al. |
| 2015/0176808 | A1* | 6/2015 | Takayama ........ F21V 13/04 362/299 |
| 2016/0076731 | A1 | 3/2016 | Monch et al. |
| 2016/0246161 | A1 | 8/2016 | Wang |

FOREIGN PATENT DOCUMENTS

| | | |
|---|---|---|
| CN | 104260596 A | 1/2015 |
| CN | 105676323 A | 6/2016 |
| CN | 105987313 A | 10/2016 |
| EP | 1270324 A2 | 1/2003 |
| JP | 2000115758 A | 4/2000 |
| JP | 2008-218089 A | 9/2008 |
| JP | 2015-097214 A | 5/2015 |
| JP | 2015-141766 A | 8/2015 |
| JP | 2016-075833 A | 5/2016 |
| TW | 201043860 A | 12/2010 |
| WO | 2009/053904 A2 | 4/2009 |
| WO | 2014195383 A1 | 12/2014 |

OTHER PUBLICATIONS

A machine translation of CN105987313A, published on Oct. 5, 2016 (Year: 2016). Abstract, Description, Drawings are attached.*
European Search Report dated Mar. 14, 2017 for European Patent Application No. 17/151,409.
International Preliminary Report on Patentability dated Jul. 16, 2019 for PCT International Appliation No. PCT/EP2018/050276.
International Search Report dated Feb. 26, 2018 for PCT International Application No. PCT/EP2018/050276.
Chinese Office Action dated May 28, 2020 for Chinese Patent Application No. 201880006810.

* cited by examiner

ARRAY WITH LIGHT EMITTING DIODES AND VARYING LENS

FIELD OF THE INVENTION

The invention relates to an array with light emitting diodes and varying lens. The invention further relates to a flash light comprising one or more of the LED array modules.

BACKGROUND OF THE INVENTION

Adaptive flash needs higher beam shaping control than conventional flash in order to direct flux into specific areas of the scene. One way to achieve this is to have an array of small LEDs and different optics per LED (array of lenses). While this might keep thickness small, it requires larger lateral area to accommodate all the lenses. This larger area is not generally acceptable for space constrained uses such as mobile phones flash systems.

SUMMARY OF THE INVENTION

It is an object of the present invention to provide a light emitting diode (LED) array module with reduced lateral area which is especially suited for a flash light of a mobile phone.

The invention is described in the independent claims. The dependent claims comprise preferred embodiments.

According to a first aspect a light emitting diode (LED) array module is provided. The LED array module comprises at least two light emitting diodes and a lens. The lens comprises one common lens segment. The common lens segment comprises a multitude of sections at least partly encompassing an axis perpendicular to the lens. The sections shape an uneven surface of the lens. The light emitting diodes are arranged to illuminate at least two non-overlapping target areas in a reference plane. The sections are arranged such that at least one light emitting diode illuminates one respective target area of the target areas. The target areas are equally sized.

The common lens segment enables a reduction of lateral size in comparison to lens arrays in which different lens segments are assigned to respective LEDs. The lens may be, for example, a Fresnel lens or a partial TIR lens or a combination thereof. It may especially be preferred that the Fresnel lens is a catadioptric Fresnel lens. The sections may be ring structure arranged around the axis or may only comprise a sector of such a ring structure. The ring structure may be preferably rotationally symmetric (e.g. circular, or any kind of discrete rotational symmetry like elliptical, quadratic shapes etc.) in case of a closed ring structure. The sections of the common segment are arranged such that flux emitted by one of the LEDs is predominantly imaged to the respective target area in order to enable a homogeneous illumination of a scene. The respective target area therefore receives substantially more of the flux of the respective LED in comparison to target areas surrounding the respective target area. The lens is therefore arranged such that the contrast of light distribution is increased by making sure that the light received from the LED by the respective target area is increased in comparison to the light received by the surrounding target areas from the same LED. The sections provide a varying profile (uneven surface) wherein the profile may depend on the distance of the section to the axis.

The at least two LEDs may be a segmented or multi-junction LED comprising at least two segments.

One LED may be imaged to one respective target area. Alternatively, two, three or more LEDs may be imaged to the same target area. There may be two, three, four or more target areas. The target areas in the reference plane describe a solid angle to which light emitted by the LEDs is imaged. The size of the target areas and the distance to the reference plane therefore describe a field of view which can be illuminated by means of the LED array module. The reference plane may, for example, be arranged in a distance of 1 m to the lens and the target areas may have a size of at least 400 mm by 400 mm. The axis may, for example, be the optical axis in case of a circular or rotational symmetric lens.

At least a part of the sections may comprise an inner side surface and an outer side surface joined by a peak, wherein an orientation of at least one of the inner side surface or outer side surface with respect to the axis changes depending on a distance between the peak and the axis at least within a defined distance to the axis.

Changing the orientation of the inner and/or outer side surface (e.g. angle of the respective side surface with respect to the axis in a common plane) of a part or all of the sections enables a tailored imaging of the light emitted by the LEDs. The defined distance may, for example, extend across a part or the whole diameter of the lens in case of a radially symmetric lens.

The inner side surface, the outer side surface and the peak may define a triangular cross section of the at least part of the sections comprising an inner side surface and an outer side surface joined by a peak. The end points of the inner and outer side surfaces away from the peak may, for example, be virtually connected by a straight line in a plane comprising the axis.

The inner side surface of the triangular cross sections may enclose an angle with respect to a plane perpendicular to the axis. The angle may decrease with increasing distance to the axis. The angle may decrease with each section or two, three or more of the sections may enclose the same angle with the axis.

The sections may provide a saw tooth like cross-section in the plane comprising the axis. Each tooth is characterized by a triangular cross section wherein the sides of the triangle may be straight or curved. The triangular cross section may, for example, be characterized by three internal angles, wherein the sum of the internal angles is 180°. The sides of the virtual triangle may be straight in this case. A part of the sections may alternatively or in addition comprise an inner side surface or an outer side surface which is curved in the plane comprising the axis.

The sections may be closed around the axis in order to shape a ring structure as described above.

The sections may be rotational symmetric with respect to the axis. The sections may, for example, be concentric ring structures or elliptical ring structures wherein the axis is arranged in the center point of both axis of the ellipse.

The at least two light emitting diodes may be arranged in a plane perpendicular to the axis. The lens may be arranged to image light emitted by a first light emitting diode depending on a distance of the first light emitting diode to the axis to a first respective target area. The first respective target area may be arranged point symmetric to the first light emitting diode with respect to the center of the lens.

The lens and especially the sections may be arranged such that at least 15%, more preferably 20% of a flux received by all target areas in the reference plane and emitted by the at least one light emitting diode is received by the respective target area. The flux received by the respective target area is at least 130%, more preferably at least 150% of a flux received by a neighboring equally sized target area of the respective target area from the at least one light emitting diode.

The lens and especially the sections enable an increased contrast between the respective target area and target areas assigned to other than the at least one light emitting diode which are arranged around the respective target area. It may be preferred that the respective target area receives at least 30% of the flux received by all target areas in the reference plane and wherein the flux received by the respective target area is at least 170% or even 200% of the flux received by any of the surrounding or neighboring target areas.

The light emitting diodes may be arranged in a regular array pattern. The light emitting diodes may, for example, be arranged in a rectangular pattern. A center of one of the light emitting diodes may be arranged on the axis.

A light emitting diode which center is arranged on the axis may be arranged in a center of the array. The other LEDs may be arranged in a rectangular or hexagonal pattern around the center LED. The LED on the axis may alternatively or in addition be surrounded by a circular shaped LED.

According to a further aspect a flash light is provided. The flash light may comprise one, two, three or more light emitting diode array modules as described above.

It shall be understood that a preferred embodiment of the invention can also be any combination of the dependent claims with the respective independent claim.

Further advantageous embodiments are defined below.

These and other aspects of the invention will be apparent from and elucidated with reference to the embodiments described hereinafter.

BRIEF DESCRIPTION OF THE DRAWINGS

The invention will now be described, by way of example, based on embodiments with reference to the accompanying drawings.

In the drawings.

DETAILED DESCRIPTION OF EMBODIMENTS

Various embodiments of the invention will now be described by means of the Figures.

Figure 1:
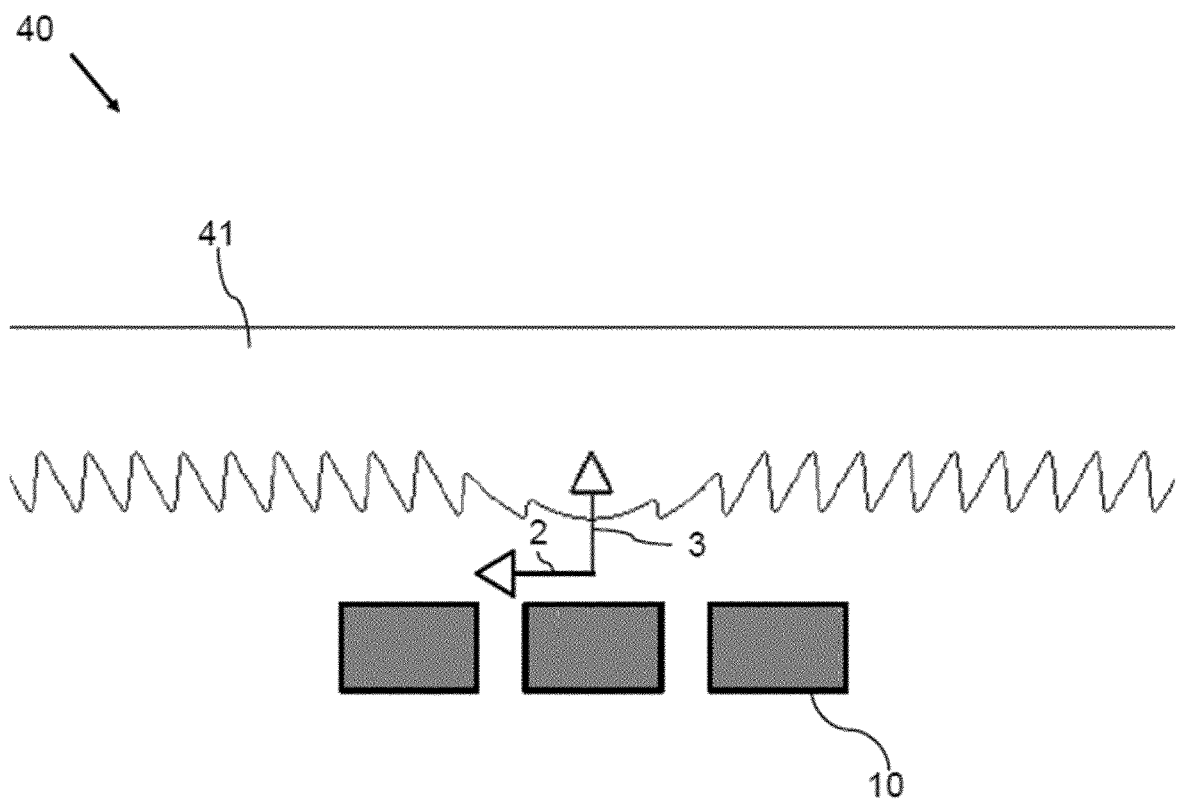
FIG. 1 shows a principal sketch of a cross-section of a conventional LED array module

FIG. 1 shows a principal sketch of a cross-section of a conventional LED array module 40. The conventional LED array module 40 comprises nine LEDs 10 which are arranged in a regular rectangular 3×3 pattern in a plane parallel to a standard circular symmetric Fresnel lens 41 (see also FIG. 6). The cross section is taken across the second column of the 3×3 array. The columns are arranged on or parallel to the y-axis 2 and the rows of the array are arranged on or parallel to the x-axis 1. The cross section shows the plane of the y-axis 2 and the z-axis 3.

Figure 2:
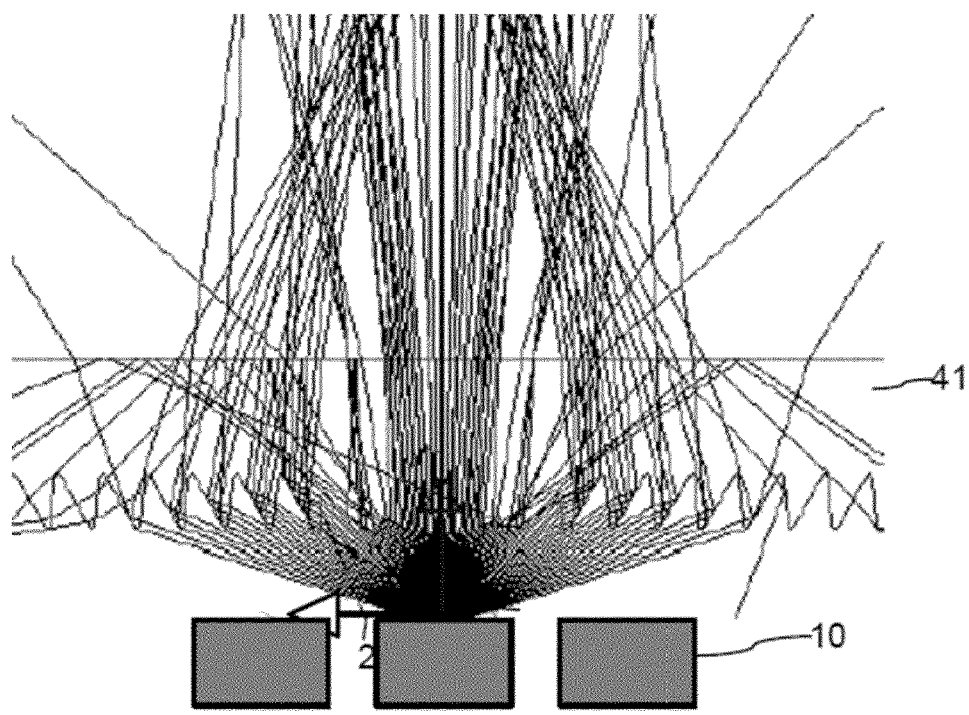
FIG. 2 shows ray tracing simulations of light emitted by a center LED of the conventional LED array module

FIG. 2 shows ray tracing simulations of light emitted by a center LED of the conventional LED array module 40. The center LED is the LED 10 in the middle shown in FIG. 1. The ray tracing simulations show that most of the light emitted by the center LED is focused or imaged to a target area which is arranged in the center of all target areas in the reference plane (similar as shown and discussed with respect to FIG. 7).

Figure 3:
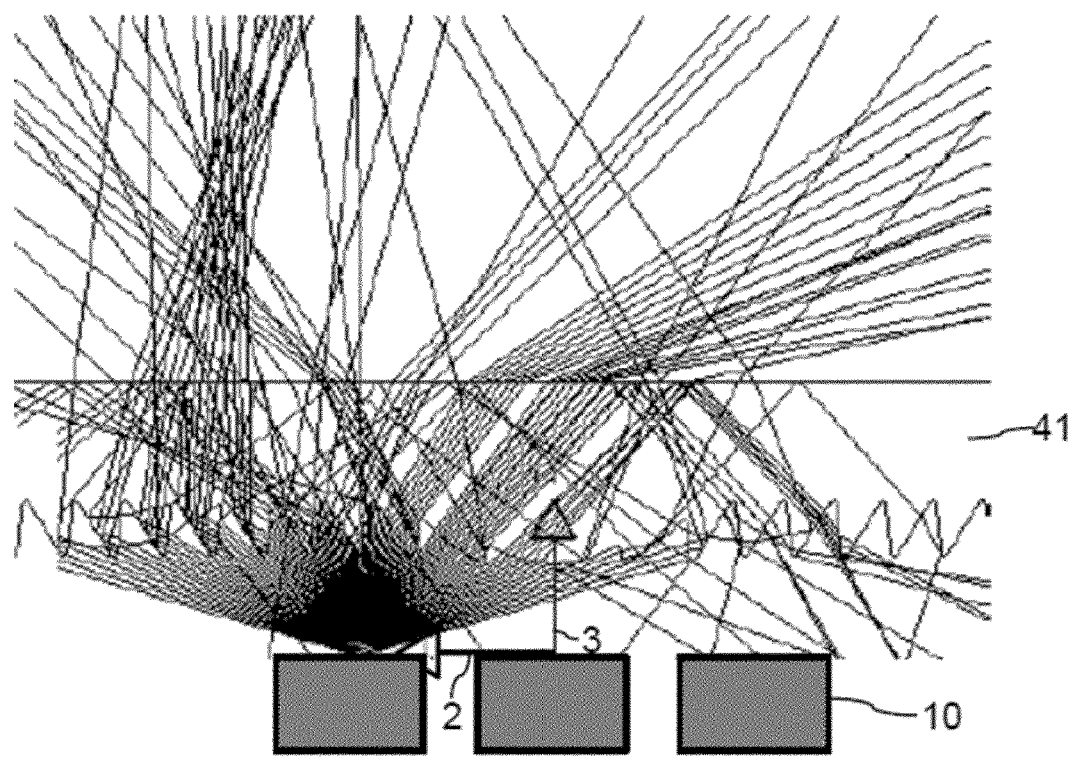
FIG. 3 shows ray tracing simulations of light emitted by a corner LED of the conventional LED array module
Figure 4:
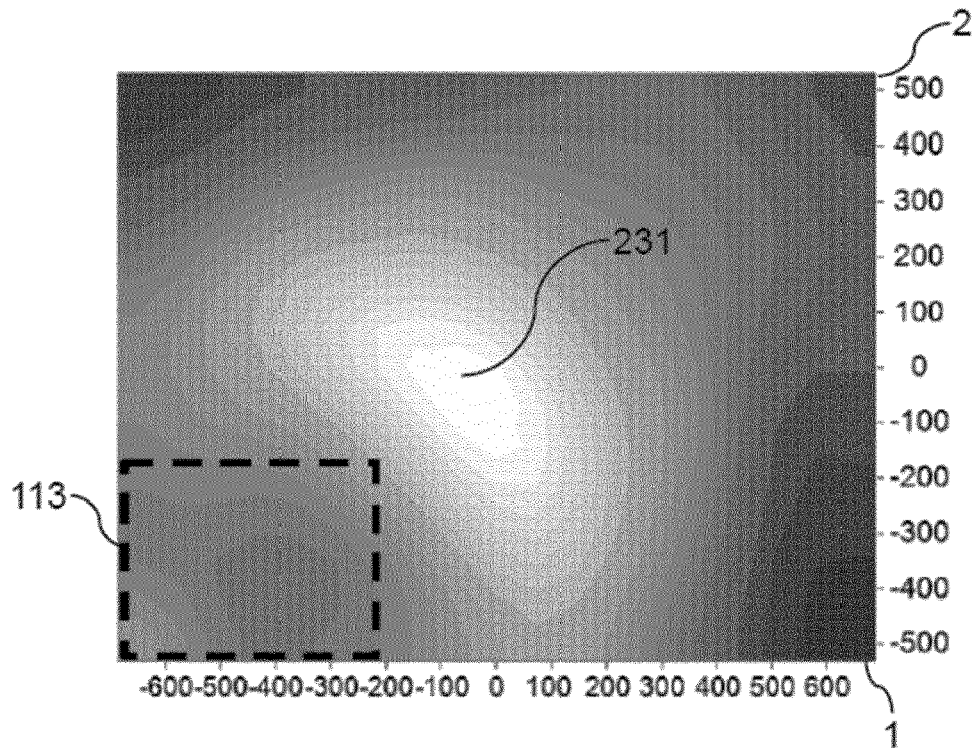
FIG. 4 shows the flux of the corner LED in the reference plane
Figure 6:
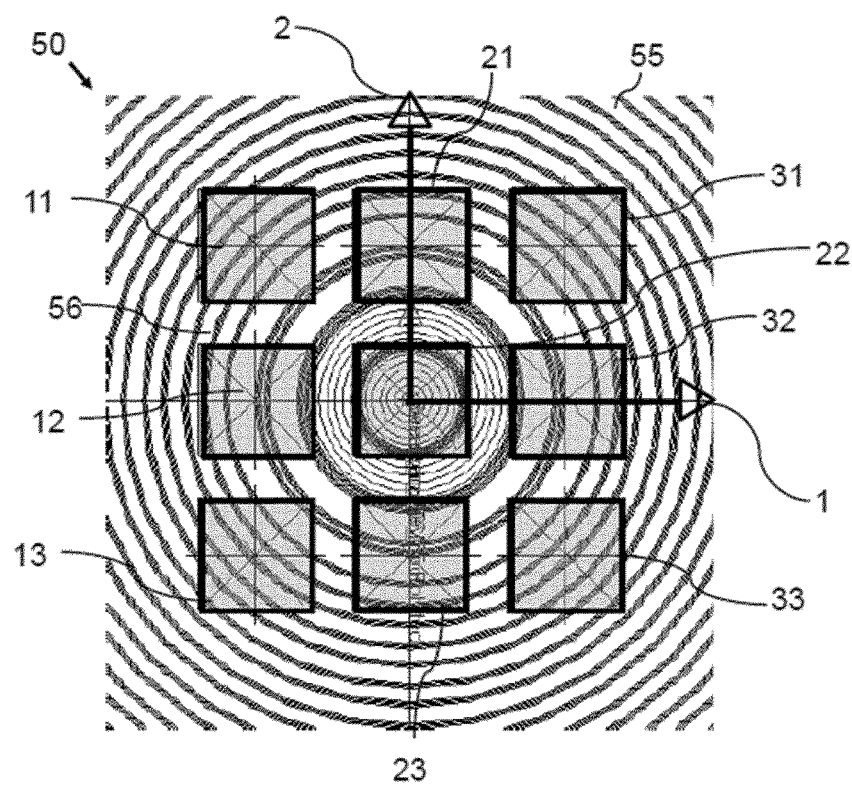
FIG. 6 shows a principal sketch of a top view of the first embodiment of the LED array module

FIG. 3 shows ray tracing simulations of light emitted by a corner LED 31 of the conventional LED array module 40 which is arranged in the third column and first row of the conventional LED array module 40 (arrangement of LEDs in the array as shown in FIG. 6). The corner LED 31 is arranged in the upper right corner of the 3×3 array. The light emitted by the corner LED 31 should be imaged by means of the standard Fresnel lens 41 to the target area 113 of corner LED 31 which is arranged in the lower left corner in the reference plane as shown in FIG. 4. FIG. 4 shows a simulated image 231 of the illuminance distribution of the corner LED 31 in the reference plane which is in this example arranged at a distance of 1 m with respect to the surface of the standard Fresnel lens 41. FIG. 4 shows the intended field-of-view of the conventional LED array module 40. The field-of-view comprises nine target areas which are arranged next to each other wherein each target area corresponds to one LED of the LED array (or each LED is assigned to one respective target area). The numbers provided at the right side of the simulated image 231 indicate a size of the target area 113 along the y-axis 2 in the reference plane. The numbers provided below the simulated image 231 indicate a size of the target area 113 along the x-axis 1 in the reference plane. The size of the target areas in the reference planes at the defined distance of 1 m defines a solid angle with respect to the center of the array. Brightness of the image or pattern increases with increasing flux at the respective position in the reference plane. The simulated image 231 shows that most of the flux emitted by the corner LED 31 is received near to the center of the field of view and thus outside the target area 113 assigned to the corner LED 31. The flux provided by the conventional LED array module 40 is therefore inhomogeneously distributed in the reference plane.

An alternative arrangement may be to provide an array of Fresnel lenses wherein one Fresnel lens is aligned with one LED. Such an arrangement would improve illumination of the intended scene but would at the same time increase the lateral extension of the conventional LED array module 40 because each LED needs to be aligned with a separate lens segment with adapted imaging properties.

Figure 5:
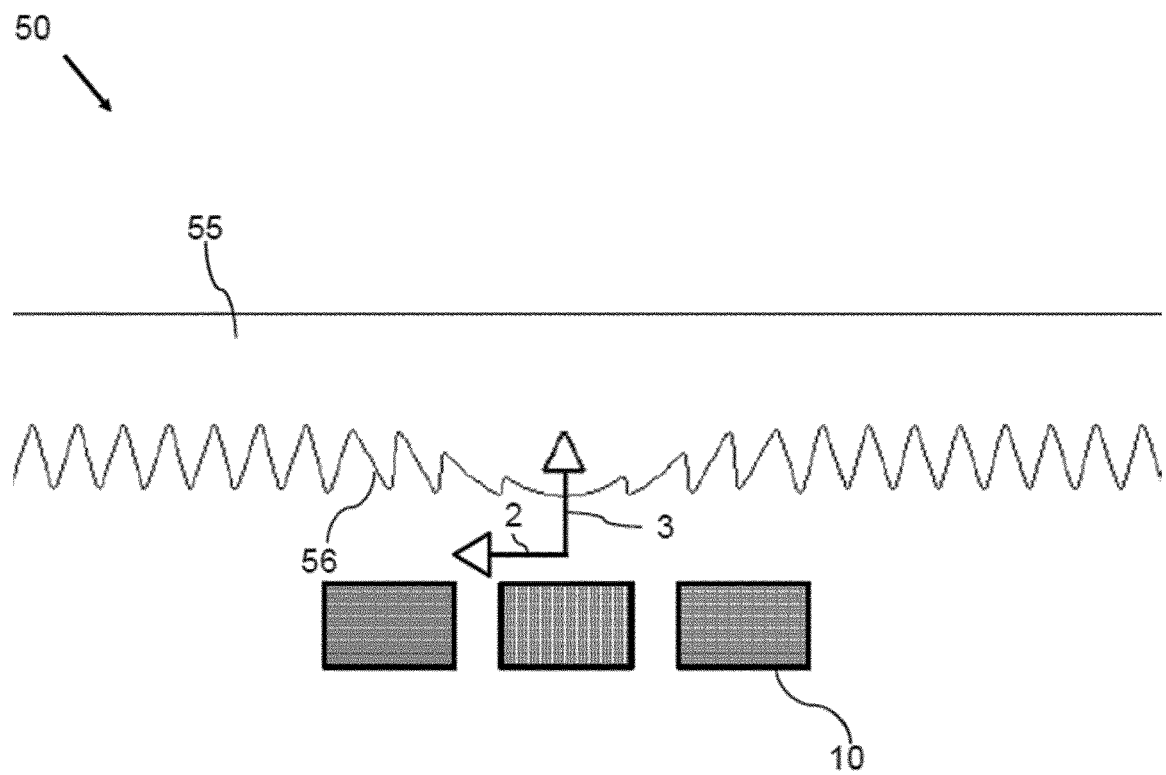
FIG. 5 shows a principal sketch of a cross-section of a first embodiment of a LED array module

FIG. 5 shows a principal sketch of a cross-section of a first embodiment of a LED array module 50. The general configuration is similar to the configuration discussed with respect to FIG. 1. The LED array module 50 comprises in this case a lens 55 which is a Fresnel type lens comprising a multitude of rotational symmetric sections 56 (see FIG. 6) arranged around an axis, wherein the axis is in this case identical with the z-axis 3. The sections shape or provide an uneven surface of the lens 55, wherein the uneven surface is in this embodiment arranged near to the LEDs 10. Each section 56 (besides of the center section) comprises an inner side surface arranged nearer to the axis and an outer side surface arranged farer from the axis. The inner side surface is joined with the outer side surface by a peak. The cross-section of the uneven surface therefore comprises saw tooth like structures. The orientation of the saw tooth with respect to the axis changes within a defined range from the axis in order to image each LED 10 of the array to the respective target area 112, 113, 122. The refractive and reflective (total internal reflection) properties of the sections which are at least partially determined by the orientation of the saw tooth are aligned with the LED from which the respective part of the lens 55 receives most light (see ray tracing simulations in FIG. 2 and FIG. 3).

FIG. 6 shows a principal sketch of a top view of the first embodiment of the LED array module 50 in which 9 LEDs are arranged in a regular rectangular array in a plane below the lens 55. LED 11 is arranged in the first column and first row of the array (upper left corner). LED 32 is arranged in the third column and second row of the array. The center LED 22 is arranged in the second column and second row of the array. The center of LED 22 is further arranged on the axis of the LED array module 50 which is in this case also the optical axis of the lens 55.

Figure 7:
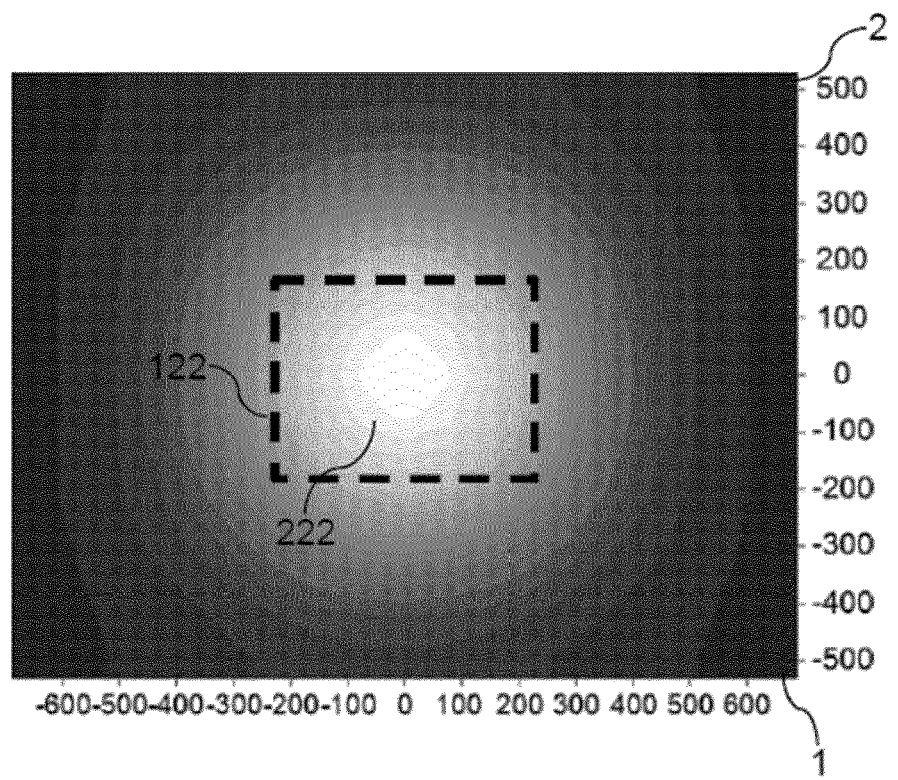
FIG. 7 shows the flux of a center LED of the first embodiment in the reference plane

FIG. 7 shows a simulated flux of a center LED 22 of the first embodiment in the reference plane. Brightness of the image or pattern increases with increasing flux. The image 222 of the center LED 22 of the 3×3 array is perfectly aligned with the respective or corresponding target area 122 of center LED 22, wherein the corresponding target area 122 of center LED 22 is arranged in the center of the intended field-of-view of the LED array module 50. The modification of the lens does therefore essentially not influence imaging of light emitted by the center LED 22 in the respective solid angle of the scene.

Figure 8:
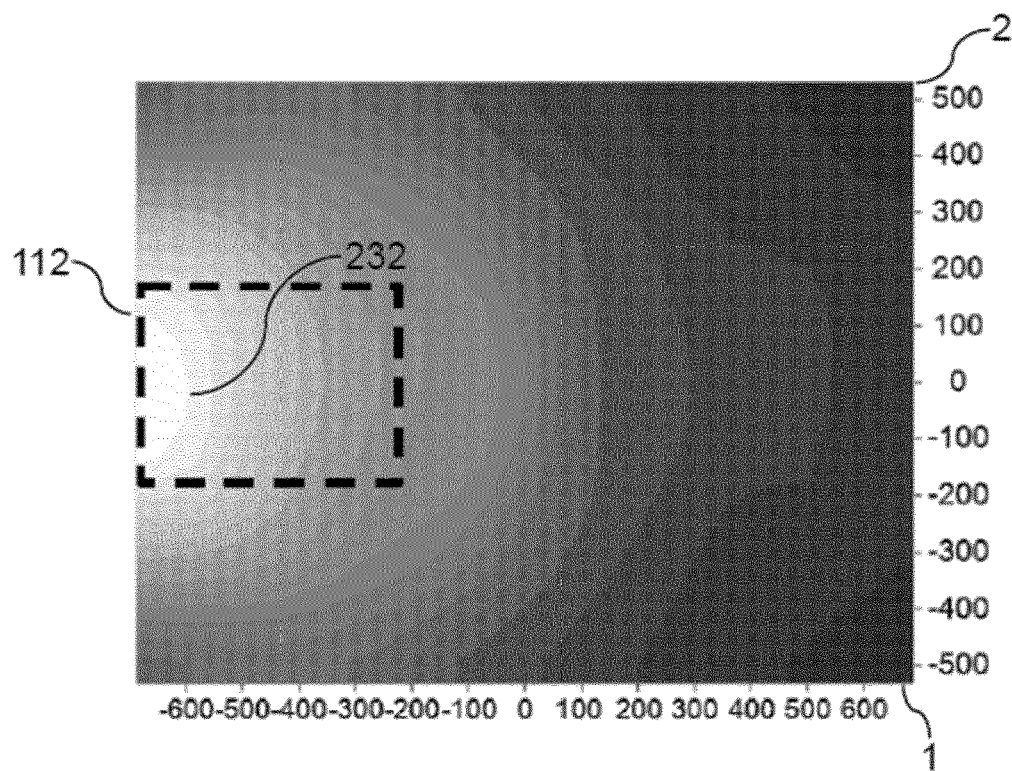
FIG. 8 shows the flux of a side LED of the first embodiment in the reference plane

FIG. 8 shows the flux of a side LED 32 of the first embodiment in the reference plane. The side LED 32 is arranged in the third column and second row of the 3×3 array. The image 232 of side LED 32 is aligned with the respective target area 112 of side LED 32. The standard Fresnel lens 41 shown in FIG. 1 would image most of the flux near to the center of the field-of-view such that target area 122 would receive much more flux in comparison to target area 112 assigned to side LED 32.

Figure 9:
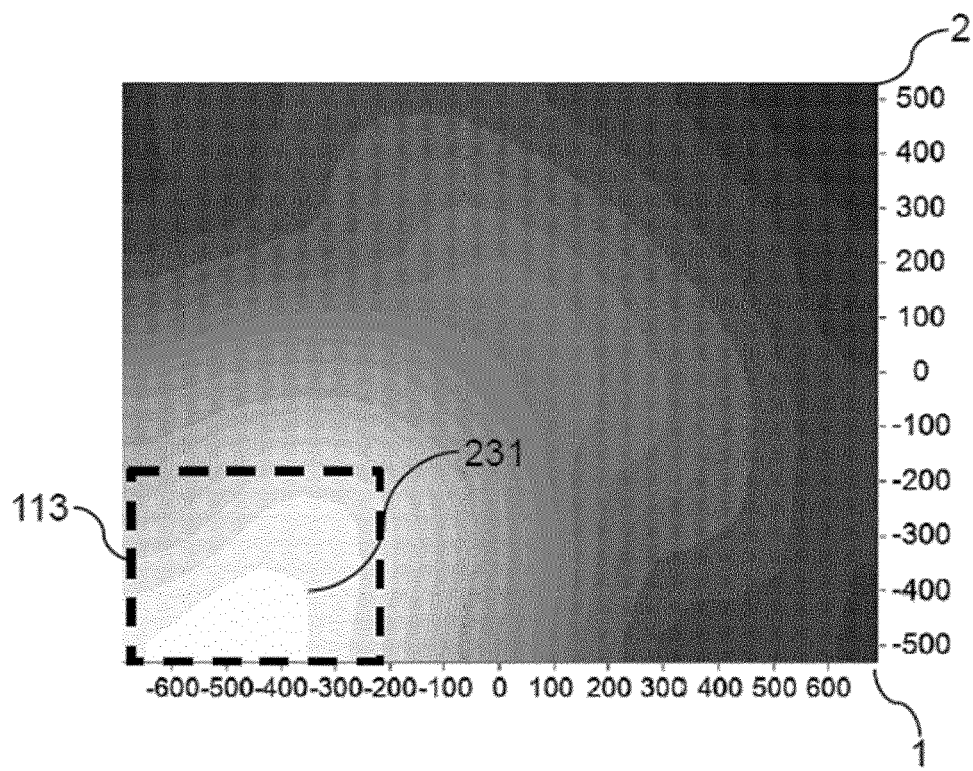
FIG. 9 shows the flux of a corner LED of the first embodiment in the reference plane

FIG. 9 shows the flux of a corner LED 31 of the first embodiment of the LED array module 50 in the reference plane. The corner LED 31 is arranged in the third column and first row of the LED array module 50 similar as discussed above with respect to a conventional LED array module 40 and FIGS. 3 and 4. A comparison of FIG. 4 with FIG. 9 shows that much more light emitted by the corner LED 31 is received in the target area 113 assigned to the corner LED 31 (the target area is arranged point symmetric to the assigned LED with respect to the center of lens 55). The flux provided by the LED array module 50 is thus arranged to provide an essentially homogeneous flux in the field of view defined by the in this case again nine equally sized target areas, wherein each target area is assigned or corresponds to one LED 11, 12, 13, 21, 22, 23, 31, 32, 33.

This principle also applies to other embodiments of the LED array module 50 comprising, for example, an array of 1×3 LEDs, 4×4 LEDs, 3×5 LEDs and the like. The lens 55 may be adapted depending on the number and arrangement of LEDs in the LED array. It may therefore be possible to use, for example, only the upper half of lens 55 shown in FIG. 6 if only LEDs 11, 21, 31 are imaged. The sections 56 would in this case only partly (180°) encompass the axis perpendicular to the lens 55.

Figure 10:
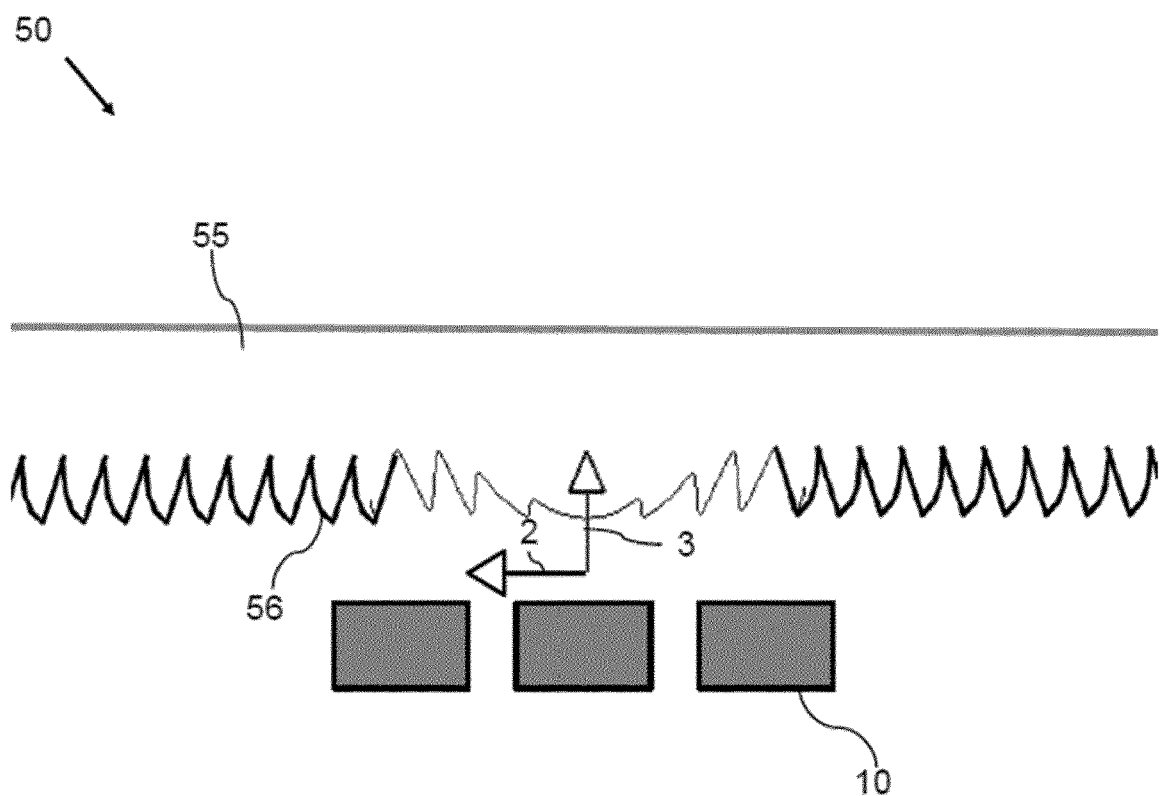
FIG. 10 shows a principal sketch of a cross-section of a second embodiment of the LED array module In the Figures, like numbers refer to like objects throughout. Objects in the Figures are not necessarily drawn to scale.

FIG. 10 shows a principal sketch of a cross-section of a second embodiment of the LED array module 50. The LED array module 50 comprises an array of 3×5 LEDs 10 wherein the cross-section is taken across the third row of the array of LEDs 10. The sections 56 are closed and elliptical in a top view (not shown) in order to enable a homogeneous light distribution in the reference plane and especially a homogeneous illumination of the intended scene. The inner side surface of the outer sections 56 (sections 5-14 counting from the middle or center of lens 55) are straight similar as discussed with respect to FIG. 5. The outer side surfaces of outer sections 56 are curved. The inner side surface, the peak and the outer side surface define a triangular cross section (connecting the endpoints of the inner side surface and the outer side surface away from the peak with a straight-line) in which the sum of the internal angles is bigger than 180°. The curvature may be adapted in accordance with the intended light pattern which should be provided within the intended field-of-view or reference plane. The curvature may, for example, change depending on the distance between the section and the axis. In an alternative embodiment the cross section of the inner side surface may be curved or the cross sections of the inner side surface and the outer side surface may be curved.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 1 x-axis
2 y-axis
3 z-axis
10 light emitting diode (LED)
11 LED first column and first row
12 LED first column and the second row
13 LED first column and third row
21 LED second column and first row
22 LED second column and second row
23 LED second column and third row
31 LED third column and first row
32 LED third column and second row
33 LED third column and third row
40 conventional light emitting diode (LED) array module
41 standard Fresnel lens
50 light emitting diode (LED) array module
55 lens 56 section
113 target area of LED third column and first row
112 target area of LED third column and second row
122 target area of LED second column and second row
231 image of LED third column and first row
232 image of LED third column and second row
222 image of LED second column and second row

The invention claimed is:

1. A light emitting diode array module comprising:
an axial common lens having a sawtooth pattern comprising a multitude of sections arranged symmetrically about an axis perpendicular to the lens, the sawtooth pattern including for each tooth an inner side surface and an outer side surface joined by a peak with an orientation of each tooth changing based on a defined distance to the axis; and
at least two light emitting diodes arranged in a plane perpendicular to the axis and configured to illuminate at least two non-overlapping target areas in a reference plane when imaged by the lens, the sawtooth pattern arranged such that a first of the at least two non-overlapping target areas is arranged point symmetric to a first of the at least two light emitting diodes with respect to the center of the lens.

2. The light emitting diode array module according to claim 1, wherein the lens is arranged such that at least 15% of a flux received by all of the non-overlapping target areas in the reference plane and emitted by at least one of the at least two light emitting diodes is received by a respective target area, and wherein the flux received by the respective target area is at least 130% of a flux received by a neighboring, equally sized target area of the respective target area from the at least one of the at least two light emitting diodes.

3. The light emitting diode array module according to claim 1, wherein the inner side surface, the outer side surface and the peak define a triangular cross section of at least part of the multitude of sections.

4. The light emitting diode array module according to claim 3, wherein the triangular cross section is characterized by three internal angles, wherein the sum of the internal angles is 180°.

5. The light emitting diode array module according to claim 1, wherein at least part of the multitude of sections comprises at least one of the inner side surface and the outer side surface which is curved in a plane comprising the axis.

6. The light emitting diode array module according to claim 1, wherein the multitude of sections are closed around the axis.

7. The light emitting diode array module according to claim 4, wherein the inner side surface of the triangular cross sections encloses an angle with respect to a plane perpendicular to the axis, and wherein the angle decreases with increasing distance to the axis.

8. The light emitting diode array module according to claim 6, wherein the multitude of sections are rotational symmetric.

9. The light emitting diode array module according to claim 1, wherein the at least two light emitting diodes are arranged as part of a regular array pattern.

10. The light emitting diode array module according to claim 9, wherein the at least two light emitting diodes are arranged as part of a rectangular pattern.

11. The light emitting diode array module according to claim 9, wherein a center of one of the at least two light emitting diodes is arranged on the axis.

12. A flash light comprising:
at least one light emitting diode array module including:
an axial common lens having a sawtooth pattern comprising a multitude of sections arranged symmetrically about an axis perpendicular to the lens, the sawtooth pattern including for each tooth an inner side surface and an outer side surface joined by a peak with an orientation of each tooth changing based on a defined distance to the axis; and
at least two light emitting diodes arranged in a plane perpendicular to the axis and configured to illuminate at least two non-overlapping target areas in a reference plane when imaged by the lens, the sawtooth pattern arranged such that a first of the at least two non-overlapping target areas is arranged point symmetric to a first of the at least two light emitting diodes with respect to the center of the lens.

13. The flash light according to claim 12, wherein the lens is arranged such that at least 15% of a flux received by all of the non-overlapping target areas in the reference plane and emitted by at least one of the at least two light emitting diodes is received by a respective target area, and wherein the flux received by the respective target area is at least 130% of a flux received by a neighboring, equally sized target area of the respective target area from the at least one of the at least two light emitting diodes.

14. The flash light according to claim 12, wherein the inner side surface, the outer side surface and the peak define a triangular cross section of at least part of the multitude of sections.

15. The flash light according to claim 14, wherein the triangular cross section is characterized by three internal angles, wherein the sum of the internal angles is 180°.

16. The flash light according to claim 12, wherein at least part of the multitude of sections comprises at least one of the inner side surface and the outer side surface which is curved in a plane comprising the axis.

17. The flash light according to claim 12, wherein the multitude of sections are closed around the axis.

18. The flash light according to claim 12, wherein the at least two light emitting diodes are arranged as part of a regular array pattern.

19. The flash light according to claim 12, wherein a center of one of the at least two light emitting diodes is arranged on the axis.

* * * * *